United States Patent
Takeda et al.

(10) Patent No.: US 7,737,046 B2
(45) Date of Patent: Jun. 15, 2010

(54) QUANTUM DOT ARRAY AND PRODUCTION METHOD THEREFOR, AND DOT ARRAY ELEMENT AND PRODUCTION METHOD THEREFOR

(75) Inventors: Yasuhiko Takeda, Aichi (JP); Tomoyoshi Motohiro, Aichi (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 171 days.

(21) Appl. No.: 11/791,445

(22) PCT Filed: Nov. 24, 2005

(86) PCT No.: PCT/JP2005/022029

§ 371 (c)(1),
(2), (4) Date: Apr. 21, 2008

(87) PCT Pub. No.: WO2006/057425

PCT Pub. Date: Jun. 1, 2006

(65) Prior Publication Data

US 2009/0011579 A1    Jan. 8, 2009

(30) Foreign Application Priority Data

Nov. 24, 2004  (JP)  ............... 2004-339625
Aug. 16, 2005  (JP)  ............... 2005-236057

(51) Int. Cl.
*H01L 21/469* (2006.01)
(52) U.S. Cl. .................. 438/761; 438/962; 257/13; 257/E29.071; 977/774
(58) Field of Classification Search ........... 438/761, 438/962; 257/E29.071; 977/755, 774
See application file for complete search history.

(56) References Cited

U.S. PATENT DOCUMENTS 5,932,354 A * 8/1999 Takeda et al. ............... 428/426

(Continued)

FOREIGN PATENT DOCUMENTS

JP    5-90612    4/1993

(Continued)

OTHER PUBLICATIONS

D-X Ye et al., "Growth of uniformly aligned nanorod arrays by oblique angle deposition with two-phase substrate rotation", Nanotechnology 15 (2004), pp. 817-821.*

(Continued)

*Primary Examiner*—Ha Tran T Nguyen
*Assistant Examiner*—Daniel Whalen
(74) *Attorney, Agent, or Firm*—Finnegan, Henderson, Farabow, Garrett & Dunner, LLP

(57) ABSTRACT

The present invention is a method of manufacturing a quantum dot array having a plurality of columnar parts including a quantum dot on a substrate, the method comprising the steps of obliquely vapor-depositing a material constituting a first barrier layer to become an energy barrier against the quantum dot onto a surface of the substrate, so as to form a plurality of first barrier layers; obliquely vapor-depositing a material constituting the quantum dot with respect to the surface of the substrate, so as to form the quantum dots on the first barrier layers; and obliquely vapor-depositing a material constituting a second barrier layer to become an energy barrier against the quantum dot with respect to the surface of the substrate, so as to form the second barrier layers on the quantum dots.

9 Claims, 17 Drawing Sheets

U.S. PATENT DOCUMENTS

2005/0092980 A1\* 5/2005 Chen et al. .................... 257/14

FOREIGN PATENT DOCUMENTS

| | | |
|---|---|---|
| JP | 2004-193525 | 7/2004 |
| WO | WO 2004/055872 A3 | 7/2004 |

OTHER PUBLICATIONS

M. Suzuki et al., "Morphological Stability of $TiO_2$ Thin Films with Isolated Columns," Japanese Journal of Applied Physics, vol. 40, Part 2, No. 4B, pp. L398-L400 (Apr. 15, 2001).

M. Suzuki et al., "Numerical Study of the Effective Surface Area of Obliquely Deposited Thin Films," Journal of Applied Physics, vol. 90, No. 11, pp. 5599-5605 (Dec. 1, 2001).

\* cited by examiner

QUANTUM DOT ARRAY AND PRODUCTION METHOD THEREFOR, AND DOT ARRAY ELEMENT AND PRODUCTION METHOD THEREFOR

CROSS-REFERENCE TO RELATED APPLICATIONS

This application is a national phase application of International Application No. PCT/JP2005/022029, filed Nov. 24, 2005, and claims the priority of Japanese Application Nos. 2004-339625, filed Nov. 24, 2004, and 2005- 236057, filed Aug. 16, 2005, the content of all of which is incorporated herein by reference.

TECHNICAL FIELD

The present invention relates to a quantum dot array and a method of manufacturing the same and a quantum dot array device and a method of manufacturing the same.

BACKGROUND ART

In general, a quantum dot is a minute mass on the order of several to several tens of nanometers made of a semiconductor, metal, or the like, and can three-dimensionally confine electrons and holes therein. Such a confining effect quantizes the movement of electrons and holes in the quantum dot, thereby forming discrete energy levels. When a plurality of such quantum dots are arranged into an array, so as to form a quantum dot array, a quantum dot laser excellent in energy efficiency and temperature stability and the like can be realized.

As a method of manufacturing such a quantum dot array, one manufacturing a quantum dot array by patterning which employs photolithography and one manufacturing a quantum dot array by self-organization utilizing the SK (Stranski-Krasnotav) growth mode in thin-film growth have also been known.

However, the manufacturing method utilizing photolithography complicates the process and lowers the production efficiency, thereby raising the cost of devices using the quantum dot array. When cost-cutting is intended, on the other hand, the area is hard to increase.

The manufacturing method utilizing the SK growth mode utilizes the lattice constant difference between a material constituting the quantum dot and a material constituting a barrier layer, thereby limiting combinations of the materials constituting the quantum dot and barrier layer. Also, this method is hard to regulate the number density of quantum dots on a substrate. When quantum dots and barrier layers are to be laminated alternately in the film thickness direction, the barrier layers must increase their thickness in order to alleviate their lattice strain.

Therefore, a method of forming a plurality of columnar quantum dots on a substrate by obliquely vapor-depositing a material constituting the quantum dots onto the substrate has been proposed (see Suzuki and two others, "Morphological Stability of TiO2 Thin Films with Isolated Columns", Japanese Journal of Applied Physics Part 2, Vol. 40, p. L398-L400, 2001).

DISCLOSURE OF THE INVENTION

The inventors found the following. Namely, when obliquely vapor-depositing a material constituting a quantum dot onto a substrate, minute masses having uneven sizes are formed on the substrate at an initial stage, and then masses having a specific size gradually grow in a selective manner, so as to form columns. Than is, finer masses are formed between the columns, whereby quantum dots having uneven sizes are formed on the substrate. This makes it hard for the quantum dot array and a quantum dot array device using the same to attain desirable characteristics.

In view of the circumstances mentioned above, it is an object of the present invention to provide a quantum dot array and a method of manufacturing the same and a quantum dot array device and a method of manufacturing the same which can improve the uniformity in sizes of a plurality of quantum dots.

For achieving the above-mentioned object, the present invention provides a method of manufacturing a quantum dot array having a plurality of columnar parts including a quantum dot on a substrate, the method comprising a first step of obliquely vapor-depositing a material constituting a first barrier layer to become an energy barrier against the quantum dot with respect to a surface of the substrate, so as to form a plurality of first barrier layers; a second step of obliquely vapor-depositing a material constituting the quantum dot with respect to the surface of the substrate, so as to form the quantum dots on the respective first barrier layers; and a third step of obliquely vapor-depositing a material constituting a second barrier layer to become an energy barrier against the quantum dot with respect to the surface of the substrate, so as to form the second barrier layers on the respective quantum dots.

This manufacturing method initially forms first barrier layers on a substrate. Here, while a material constituting the first barrier layer is obliquely vapor-deposited with respect to the surface of the substrate, masses smaller than the first barrier layers adjacent to each other are formed therebetween. Namely, the first barrier layers and masses have sizes different from each other. However, the first barrier layers and masses do not have a function of confining electrons and holes by themselves, and thus do not function as quantum dots, whereby performances of a device using the resulting quantum dot array are unaffected even when the sizes of the first barrier layers and masses are different from each other. Next, a material constituting a quantum dot is obliquely vapor-deposited with respect to the surface of the substrate, whereby quantum dots are formed on the respective first barrier layers. Since the first barrier layers grow from the substrate, the material constituting the quantum dot is fully prevented from intruding between the first barrier layers even when obliquely vapor-deposited. Therefore, the quantum dots are formed on the first barrier layers, but not on the masses. Hence, the uniformity in sizes of quantum dots can be improved. Thereafter, a material constituting a second barrier layer to become an energy barrier against the quantum dots is obliquely vapor-deposited with respect to the surface of the substrate, whereby the second barrier layers are formed on the quantum dots.

Since the first barrier layers, quantum dots, and second barrier layers are obliquely vapor-deposited with respect to the surface of the substrate, the process becomes simpler, so that the production efficiency improves, whereby the cost of the device using the quantum dot array can be cut down. Since it is unnecessary to use expensive apparatus, a larger area is easier to attain at low cost. Since the forming of columnar structures by oblique vapor deposition is basically caused by a geometric arrangement at the time of vapor deposition, the degree of freedom in combinations of materials constituting the quantum dots and barrier layers can be raised, whereby various kinds of quantum dot arrays can be manufactured.

Further, the number density of quantum dots on the substrate is easier to regulate, while there is no problem of lattice strain between the quantum dot and the first or second barrier layer, whereby the thickness of the first or second barrier layer can be made sufficiently small.

Preferably, in the above-mentioned manufacturing method, the substrate is rotated about a normal of the surface of the substrate in the first, second, and third steps. This can further improve the uniformity in sizes of the quantum dots.

Preferably, the above-mentioned manufacturing method further comprises a fourth step of obliquely vapor-depositing a material constituting the quantum dot with respect to the surface of the substrate, so as to form the quantum dots on the respective second barrier layers; and a fifth step of obliquely-depositing a third barrier layer to become an energy barrier against the quantum dot with respect to the surface of the substrate, so as to form the third barrier layers on the respective quantum dots. This can arrange the quantum dots three-dimensionally, whereby the area density of quantum dots can be increased.

Preferably, the substrate is rotated about a normal of the surface of the substrate in the first to fifth steps. This can further improve the uniformity in sizes of the quantum dots.

In another aspect, the present invention provides a quantum dot array obtained by the above-mentioned method of manufacturing a quantum dot array. This quantum dot array can improve the uniformity in sizes of quantum dots, whereby a device having a desirable characteristic can be realized.

In still another aspect, the present invention provides a method of manufacturing a quantum dot array device comprising a quantum dot array obtained by the above-mentioned method of manufacturing a quantum dot array and a conductive film formed on the plurality of columnar parts of the quantum dot array, the substrate having a conductive part, the method comprising a conductive film forming step of forming the conductive film on the plurality of columnar parts of the quantum dot array by vapor deposition of a first conductive material and an intrusion prevention layer forming step of forming intrusion prevention layers for preventing the first conductive material from intruding between the plurality of columnar parts on the respective columnar parts by vapor deposition of a second conductive material before the conductive film forming step after forming the plurality of columnar parts. In the present invention, "vapor deposition" includes not only vapor deposition by energized heating and vapor deposition by electron beams, but also vapor deposition by sputtering.

This manufacturing method can improve the uniformity in sizes of quantum dots, whereby a quantum dot array device having a desirable characteristic can be realized. Since intrusion prevention layers for preventing the first conductive material from intruding between a plurality of columnar parts are formed before forming a conductive film after forming the columnar parts, the first conductive material is fully prevented from intruding between the plurality of columnar parts when forming the conductive film by vapor-depositing the first conductive material. This fully prevents the quantum dots of the columnar parts adjacent to each other from short-circuiting and the quantum dots of one columnar part from short-circuiting, whereby the quantum dot array device is fully prevented from failing to function normally.

Specific methods suitable for forming the intrusion prevention layers are:

(1) obliquely vapor-depositing the second conductive material with respect to the surface of the substrate, so as to form the intrusion prevention layer such that at least a leading end part of the intrusion prevention layer hangs over a leading end face of the adjacent columnar part when seen in a normal of the surface of the substrate; and (2) at the time of vapor-depositing the second conductive material with respect to the surface of the substrate, the vapor deposition angle with respect to the normal of the surface of the substrate is changed so as to become gradually smaller while rotating the substrate, thereby integrating the respective intrusion prevention layers formed on the plurality of columnar parts.

In still another aspect, the present invention provides a quantum dot array device obtained by the above-mentioned method of manufacturing a quantum dot array device.

This quantum dot array device can improve the uniformity in sizes of quantum dots, whereby a quantum dot array device having a desirable characteristic can be realized. Since the conductive materials are fully prevented from intruding between a plurality of columnar parts, the quantum dots on the columnar parts adjacent to each other or on one columnar part are fully prevented from short-circuiting, whereby the quantum dot array device is fully prevented from failing to function normally.

BEST MODES FOR CARRYING OUT THE INVENTION

In the following, embodiments of the present invention will be explained in detail.

First Embodiment of Method of Manufacturing Quantum Dot Array

Figure 1:
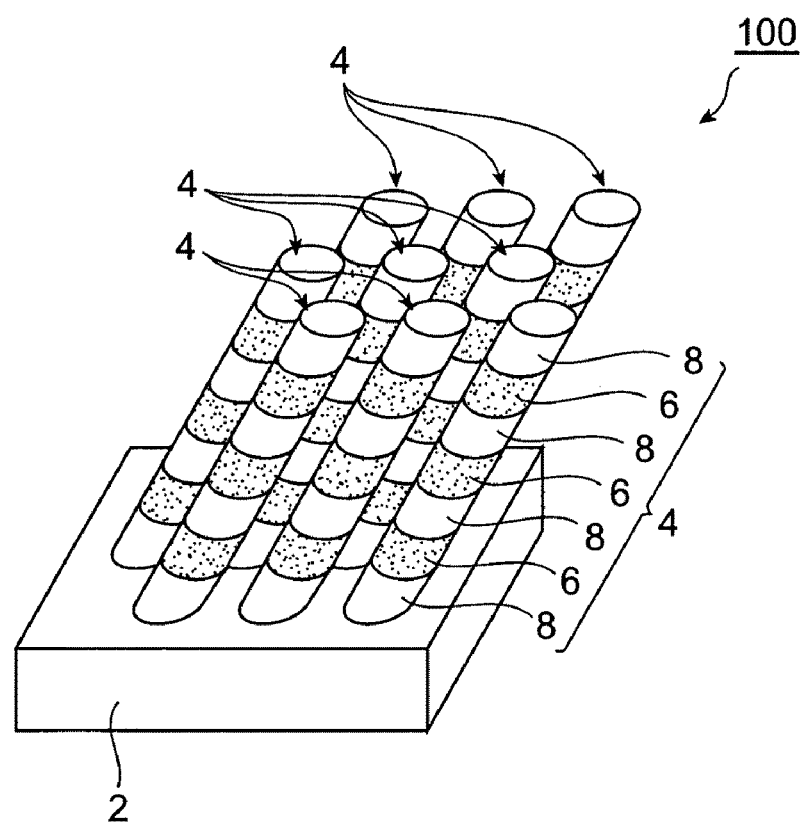
FIG. 1 is a perspective view showing an embodiment of the quantum dot array in accordance with the present invention.
Figure 2:
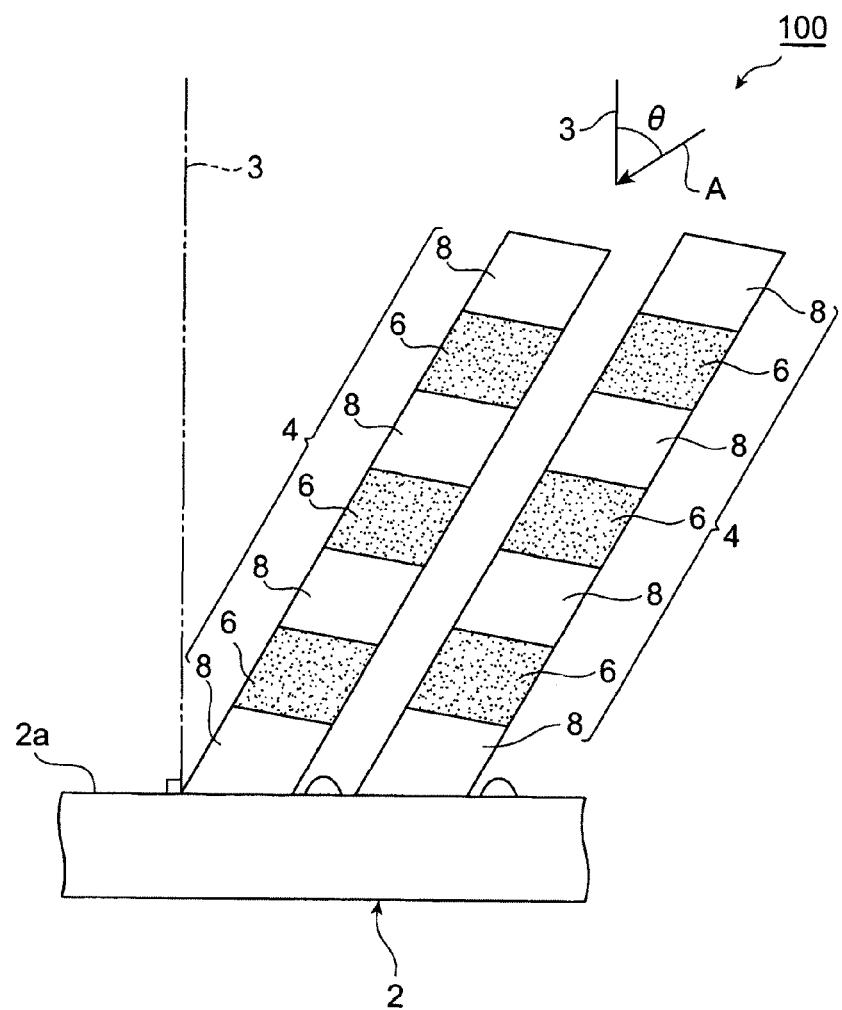
FIG. 2 is a front view partly enlarging the quantum dot array of FIG. 1.

FIG. 1 is a perspective view showing a first embodiment of the quantum dot array in accordance with the present invention, whereas FIG. 2 is a front view partly enlarging the quantum dot array 100 of FIG. 1. As shown in FIG. 1, the quantum dot array 100 has a substrate 2 and a plurality of columnar parts 4 provided on the substrate 2. The plurality of columnar parts 4 extend obliquely with respect to a normal 3 of a surface 2a of the substrate 2. Each columnar part 4 is formed by alternately laminating quantum dots 6 and barrier layers 8. Specifically, the columnar part 4 has a barrier layer 8 disposed on the substrate 2, whereas quantum dots 6 and barrier layers 8 are alternately laminated along the extending direction of the columnar part 4 on the former barrier layer 8. Therefore, the quantum dots 6 are three-dimensionally arranged in the quantum dot array 100.

Examples of materials constituting the quantum dots 6 include semiconductors and metals. Examples of the semiconductors include Si, Ge, CdS, ZnS, ZnTe, and CdTe. Examples of the metals include Au, Ag, and Cu. Materials constituting the barrier layers 8 are those acting as an energy barrier against the materials constituting the quantum dots 6, whereby electrons or holes can be confined in the quantum dots 6. The materials constituting the barrier layers 8 are not restricted in particular as long as they act as an energy barrier against the materials constituting the quantum dots 6, whereby $SiO_2$, $Al_2O_3$, $Si_3N_4$, and the like are used, for example. The quantum dot 6 and barrier layer 8 can be constituted by Si and $SiO_2$, respectively, for example.

The above-mentioned quantum dot array 100 is manufactured by the following manufacturing method.

First, the substrate 2 is prepared. As the substrate 2, a silicon wafer or the like can be used, for example.

Next, the substrate 2 is placed within an electron beam vapor deposition apparatus, for example. Here, the electron beam vapor deposition apparatus comprises a vessel (not depicted) and a lid. Provided within the vessel are a barrier layer vapor deposition source container (not depicted) for accommodating a vapor deposition source for the barrier layers 8 and a quantum dot vapor deposition source container for accommodating a vapor deposition source for the quantum dots, whereas the vapor deposition sources for barrier layers and quantum dots are adapted to evaporate upon heating with electron beams, for example. In this electron beam vapor deposition apparatus, a fixed table is provided within the vessel, whereas the substrate 2 is secured onto the fixed table. Here, the barrier layer and quantum dot vapor deposition source containers are arranged obliquely with respect to the normal 3 of the surface 2a of the substrate 2. In other words, the angle (vapor deposition angle) θ of the vapor deposition direction (direction of arrow A in FIG. 2) with respect to the normal 3 of the surface 2a of the substrate 2 is greater than 0°. Preferably, the vapor deposition angle θ is at least 30°. When the vapor deposition angle θ is less than 30°, there is a tendency of columns getting relatively thick or their diameters becoming relatively uneven as compared with the case where the vapor deposition angle θ is 30° or greater. Even when the vapor deposition angle θ is less than 30°, however, the uniformity in sizes of a plurality of quantum dots can be improved as compared with the case where the quantum dots are formed on the substrate 2 without the aid of the first barrier layer. The vapor deposition angle θ is not greater than 90°. The substrate temperature, which is normally at room temperature here, is preferably ⅓ or less of the melting point (in terms of absolute temperature) of each vapor deposition material. When the substrate temperature is higher than ⅓ of the melting point (in terms of absolute temperature) of the vapor deposition material, there is a tendency of columns getting thicker or their diameters becoming uneven as compared with the case where the substrate temperature is ⅓ or less.

Subsequently, in the vessel, a material constituting the barrier layers 8 is accommodated in the barrier layer vapor deposition source container, whereas a material constituting the quantum dots 6 is accommodated in the quantum dot vapor deposition source container.

Figure 3:
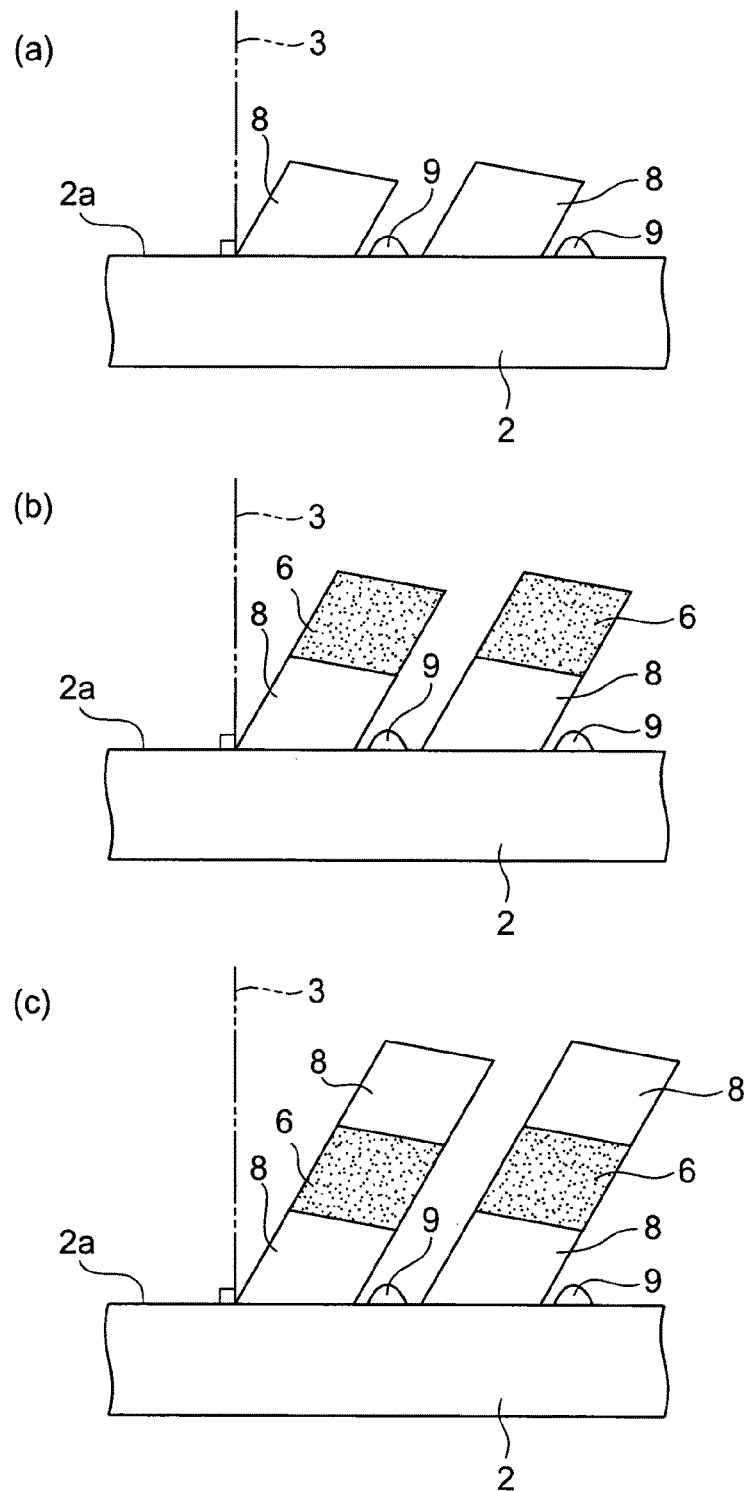
FIG. 3 is a series of process charts showing steps of a part of the method of manufacturing a quantum dot array in accordance with the present invention.

Next, the vessel is closed with the lid, and the vapor deposition source for barrier layers is irradiated with an electron beam, so as to be evaporated by heating. Since the barrier layer vapor deposition source container is positioned obliquely with respect to the normal of the surface 2a of the substrate 2, the vapor deposition source for barrier layers is obliquely vapor-deposited with respect to the surface 2a of the substrate 2. The oblique vapor deposition refers to attaching the vapor deposition source to the surface 2a of the substrate 2 from a direction oblique to the normal 3 of the surface 2a of the substrate 2. Thus, as shown in (a) of FIG. 3, a plurality of barrier layers 8 are formed on the surface 2a of the substrate 2 (first step). Here, masses 9 smaller than the barrier layers 8 are formed between the barrier layers 8 adjacent to each other.

Subsequently, the vapor deposition source for quantum dots is irradiated with an electron beam, so as to be evaporated by heating. Since the quantum dot vapor deposition source container is positioned obliquely with respect to the normal 3 of the surface 2a of the substrate 2 here, the vapor deposition source for quantum dots is obliquely vapor-deposited with respect to the surface 2a of the substrate 2. Thus, as shown in (b) of FIG. 3, quantum dots 6 are formed on the respective barrier layers 8, but not on the small masses 9 (second step). Namely, the quantum dots 6 are selectively formed on the respective barrier layers 8.

Next, the vapor deposition source for barrier layers is irradiated with an electron beam, so as to be evaporated by heating. Thus, as shown in (c) of FIG. 3, barrier layers 8 are formed on the quantum dots 6 (third step) in a manner similar to the above.

Subsequently, the vapor deposition source for quantum dots is irradiated with an electron beam again, so as to be evaporated by heating. Thus, the vapor deposition source for quantum dots is obliquely vapor-deposited on the barrier layers 8, whereby quantum dots 6 are formed on the respective barrier layers 8 (fourth step).

Next, the vapor deposition source for barrier layers is irradiated with an electron beam again, so as to be evaporated by heating. Thus, barrier layers 8 are formed on the quantum dots 6 (fifth step) in a manner similar to the above.

Subsequently, quantum dots 6 and barrier layers 8 are alternately formed as mentioned above. Thus, a plurality of columnar parts 4 are formed on the substrate 2, whereby the manufacture of the quantum dot array 100 is completed.

The above-mentioned manufacturing method initially forms the barrier layers 8 on the substrate 2. Here, the barrier layers 8 are formed by obliquely vapor-depositing a material constituting the barrier layers 8 with respect to the surface 2a of the substrate 2. At this time, between the barrier layers 8 adjacent to each other, masses 9 smaller than them are formed on the substrate 2. Namely, the barrier layers 8 and masses 9 have sizes different from each other. However, the barrier layers 8 and masses 9 do not have a function of confining electrons and holes by themselves, and thus do not function as quantum dots, whereby performances of a device using the resulting quantum dot array 100 are unaffected. Next, a material constituting the quantum dots is obliquely vapor-deposited with respect to the surface 2a of the substrate 2, whereby the quantum dots 6 are formed on the barrier layers 8. Since the barrier layers 8 grow from the substrate 2, the material constituting the quantum dots 6 is fully prevented from intruding between the barrier layers 8 even when obliquely vapor-deposited. Therefore, the uniformity in sizes of quantum dots 6 can be improved. Thereafter, a material constituting barrier layers 8 to become an energy barrier against the quantum dots 6 is vapor-deposited on the quantum dots 6 obliquely with respect to the surface 2a of the substrate 2, whereby the barrier layers 8 are formed on the quantum dots 6.

Thus, the above-mentioned manufacturing method can improve the uniformity in sizes of the quantum dots 6. Therefore, when each quantum dot 6 is used as a light-emitting part of a light-emitting device, the wavelengths of light emitted from the quantum dots 6 can be made uniform, whereby the spectrum of light generated from the quantum dots 6 can be emitted from the quantum dot array 100 as it is. When the columnar parts 4 have a specific current-voltage characteristic, this specific current-voltage characteristic can be reflected in the quantum dot array 100 as it is, since the uniformity in sizes of the quantum dots 6 can be improved. Namely, unless the uniformity in sizes of the quantum dots 6 improves, the current-voltage characteristic varies among the columnar parts 4, whereby the total current-voltage characteristic is the average of current-voltage characteristics of the columnar parts 4. Therefore, the features of current-voltage characteristics of the columnar parts 4 are not reflected as they are in the whole quantum dot array 100, whereby the respective functions of the columnar parts 4 lower. When the uniformity in sizes of the quantum dots 6 improves, however, the columnar parts 4 have the same current-voltage characteristic, whereby the current-voltage characteristic of each columnar part 4 also becomes the current-voltage characteristic of the whole quantum dot array 100.

Since the barrier layers 8, quantum dots 6, and barrier layers 8 are obliquely vapor-deposited with respect to the surface 2a of the substrate 2, the process becomes simpler, so that the production efficiency improves, whereby the cost of the device using the quantum dot array 100 can be cut down. Since no expensive apparatus is necessary for use, a larger area can easily be attained at low cost. Since vapor deposition is utilized, the degree of freedom in combinations of materials constituting the quantum dots 6 and barrier layers 8 can be raised, whereby various kinds of quantum dot arrays can be manufactured. Further, the number density of quantum dots is easier to regulate, while the lattice strain between the quantum dot 6 and barrier layer 8 yields no problem, whereby the thickness of the barrier layers 8 can be made sufficiently small. Also, manufacturing the quantum dot array 100 as mentioned above can arrange the quantum dots 6 three-dimensionally, whereby the area density of quantum dots can be increased.

Second Embodiment of Method of Manufacturing Quantum Dot Array

A second embodiment of the method of manufacturing a quantum dot array in accordance with the present invention will now be explained. Constituents identical or equivalent to those in the first embodiment will be referred to with the same numerals while omitting their overlapping explanations.

Figure 4:
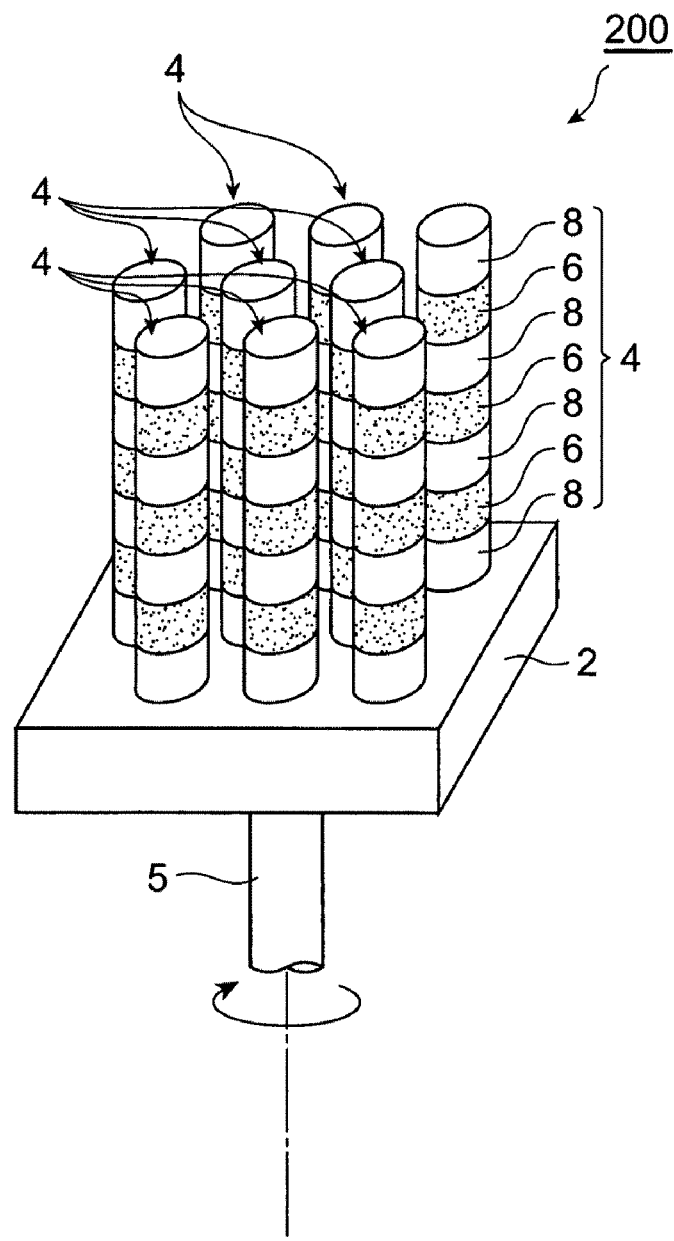
FIG. 4 is a perspective view showing another embodiment of the quantum dot array in accordance with the present invention.

The manufacturing method of this embodiment differs from that of the first embodiment in that it uses a rotatable rotary table instead of the fixed table in the electron beam vapor deposition apparatus and rotates the substrate 2 by revolving the rotary table at the time of forming the quantum dots 6 and barrier layers 8. At this time, as shown in FIG. 4, the substrate 2 is rotated about a rotary shaft 5 extending in a direction orthogonal to the surface 2a of the substrate 2, i.e., a direction normal to the surface 2a. FIG. 4 does not depict the rotary table. When the substrate 2 is thus rotated, columnar members 4 extend in a direction perpendicular to the surface 2a of the substrate 2, thereby attaining a substantially cylindrical form in a quantum dot array 200 as shown in FIG. 4. This can further improve the uniformity in sizes of the quantum dots 6 as well.

First Embodiment of Method of Manufacturing Quantum Dot Array Device

A first embodiment of the method of manufacturing a quantum dot array device in accordance with the present invention will now be explained in detail.

Before explaining the first embodiment of the method of manufacturing a quantum dot array device in accordance with the present invention, the quantum dot array device manufactured by this method will be explained with reference to FIG. 5.

Figure 5:
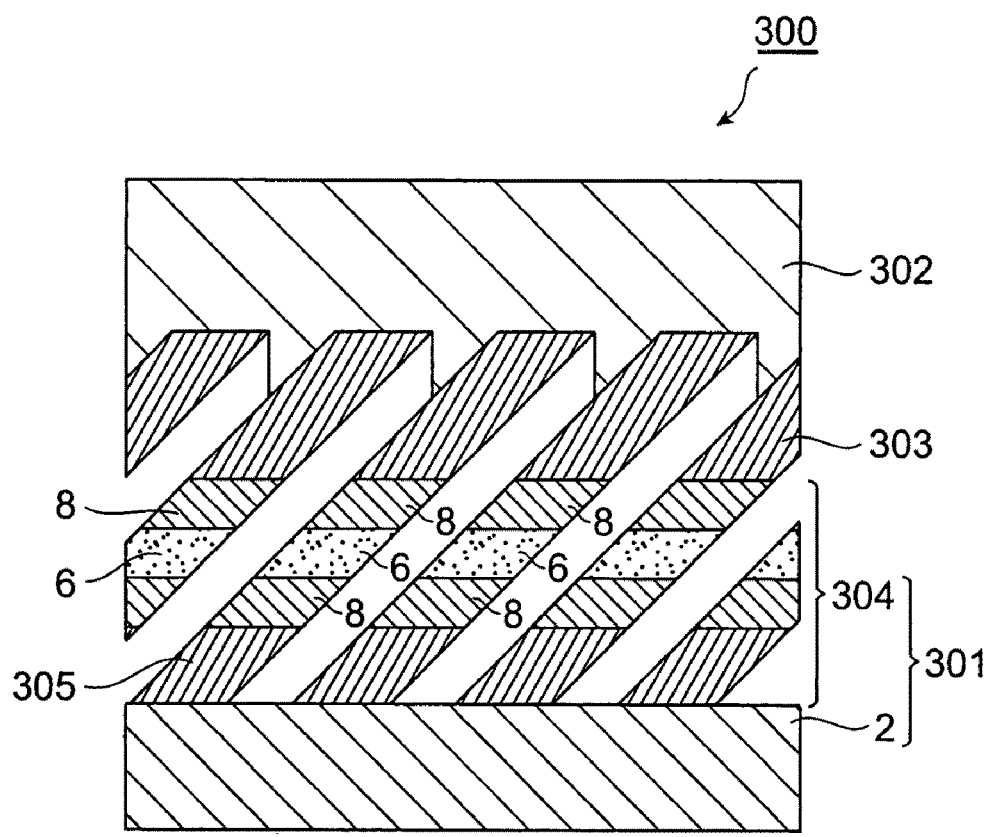
FIG. 5 is a sectional view showing an embodiment of the quantum dot array device in accordance with the present invention.

FIG. 5 is a sectional view schematically showing the quantum dot array device manufactured by the first embodiment of the method of manufacturing a quantum dot array device in accordance with the present invention. As shown in FIG. 5, the quantum dot array device 300 comprises a quantum dot array 301 and a conductive film 302 provided on a plurality of columnar parts 304 of the quantum dot array 301. Here, each of the plurality of columnar parts 304 is tilted with respect to a normal of the surface 2a of the substrate 2, and is constructed by an electrode layer 305, a barrier layer 8, a quantum dot 6, and a barrier layer 8. Here, the electrode layer 305 has a size greater than that of a quantum dot, does not function as the quantum dot, and is constituted by a conductive material such as B-doped silicon, for example. Conductive intrusion prevention layers 303 for preventing conductive materials from intruding between the plurality of columnar parts 304 at the time of manufacturing the quantum dot array device 300 are provided between the respective columnar parts 304 and the conductive film 302. Here, the intrusion prevention layers 303 on the respective columnar parts 304 are connected to the conductive film 302. Namely, the intrusion prevention layers 303 are electrically connected to each other through the conductive film 302. Each of the intrusion prevention layers 303 extends in the direction along which its corresponding columnar part 304 extends. If the intrusion prevention layers 303 are constructed by an insulating material, for example, a current caused by the tunneling effect will fail to flow through the intrusion prevention layers 303, whereby no current can flow through the columnar parts 304, which is the reason why intrusion prevention layers 303 are conductive.

The conductive film 302 is usually constituted by a metal material such as aluminum, but may also be by conductive oxides such as tin-doped indium oxide and antimony-doped tin oxide and semiconductor materials such as boron (B)-doped silicon.

Figure 6:
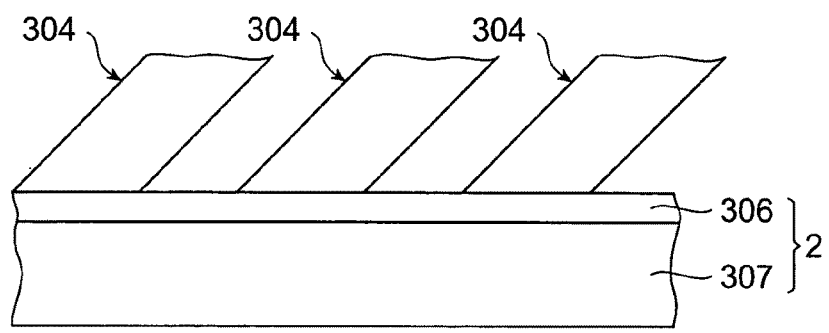
FIG. 6 is a front view showing a modified example of the substrate in FIG. 5.

The substrate 2 as a whole is constituted by a conductive part made of a conductive material. For example, the conductive material is constituted by a semiconductor material such as boron (B)-doped silicon, a metal material such as aluminum, or a conductive oxide such as tin-doped indium oxide or antimony-doped tin oxide. As shown in FIG. 6, the substrate 2 may be a multilayer body constructed by a conductive part 306 made of the above-mentioned conductive material and an insulating main part 307. In this case, the conductive part 306 is provided on the columnar part 304 side of the main part 307 so as to be in contact with the columnar parts 304.

The method of manufacturing the quantum dot array device 300 will now be explained.

First, the quantum dot array 301 is manufactured as in the first embodiment of the method of manufacturing a quantum dot array except that a boron (B)-doped silicon wafer is used as the substrate 2; that the electron beam vapor deposition apparatus further comprises a conductive film vapor deposition source container for accommodating a first conductive material as a vapor deposition source for the conductive film 302, an intrusion prevention layer vapor deposition source container for accommodating a second conductive material as a vapor deposition source for the intrusion prevention layers 303, and an electrode layer vapor deposition source for accommodating a conductive material as a vapor deposition source for the electrode layers 305; and that, when forming the columnar parts 304, the electrode layers 305 are formed between the substrate 2 and barrier layers 8 by electron beam vapor deposition, whereas only one layer of quantum dot 6 and two barrier layers 8 are formed. In the electron beam vapor deposition apparatus, the conductive film vapor deposition source container is arranged in front of the fixed table. When accommodating the materials constituting the barrier layers 8 and quantum dots 6 into the barrier layer vapor deposition source container and the quantum dot vapor deposition source container, respectively, the first and second conductive materials are accommodated in the conductive film vapor deposition source container and intrusion prevention layer vapor deposition source container, respectively.

Figure 7:
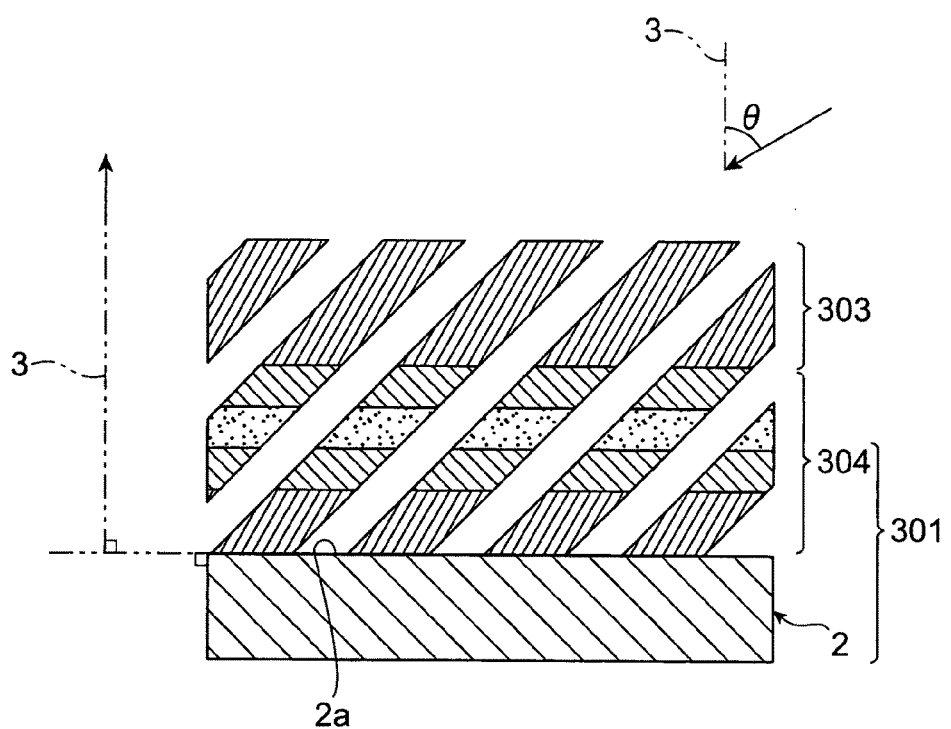
FIG. 7 is a view showing an intrusion prevention layer forming step in an embodiment of the method of manufacturing a quantum dot array device in accordance with the present invention.

Subsequently, while the quantum dot array 301 is contained in the vessel of the electron beam vapor deposition apparatus, the second conductive material as the vapor deposition source for the intrusion prevention layers 303 is irradiated with an electron beam, so as to be evaporated by heating. Here, examples of the second conductive material include semiconductor materials such as B-doped silicon and conductive oxides such as tin-doped indium oxide and antimony-doped tin oxide, though not limited in particular as long as they are conductive materials. At this time, since the intrusion prevention layer vapor deposition source container is positioned obliquely with respect to the normal of the surface 2a of the substrate 2, the vapor deposition source for intrusion prevention layers is obliquely vapor-deposited with respect to the surface 2a of the substrate 2. Thus, as shown in FIG. 7, the intrusion prevention layers 303 for preventing the first conductive material from intruding between a plurality of columnar parts 304 are formed on the respective columnar parts 304 (intrusion prevention layer forming step). At this time, the second conductive material is deposited, so as to form the intrusion prevention layers 303 such that at least a leading end part of the intrusion prevention layer 303 hangs over the leading end face of the adjacent columnar part 304 when seen in a direction normal to the surface 2a of the substrate 2. Here, the vapor deposition angle θ is the same as that in the cases of forming the barrier layers 8 and quantum dots 6, and is preferably at least 30°. However, it is not always necessary for the vapor deposition angle θ to be the same as that in the cases of forming the barrier layers 8 and quantum dots 6. For example, the intrusion prevention layers 303 can be formed in a shorter time when the vapor deposition angle θ is made greater than that in the cases of forming the barrier layers 8 and quantum dots 6.

Next, the first conductive material as the vapor deposition source for the conductive film is irradiated with an electron beam, so as to be evaporated by heating. Here, examples of the first conductive material include metals such as aluminum and conductive oxides such as tin-doped indium oxide and antimony-doped tin oxide, though not limited in particular as long as they are conductive materials. At this time, since the vapor deposition source container for the conductive film 302 is positioned in front of the surface 2a of the substrate 2, the vapor deposition source for the conductive film 302 is vapor-deposited from the front side with respect to the surface 2a of the substrate 2. Thus, as shown in FIG. 5, the conductive film 302 is formed on the plurality of intrusion prevention layers 303 (conductive film forming step). This completes the manufacture of the quantum dot array device 300.

The above-mentioned manufacturing method can improve the uniformity in sizes of quantum dots 6 in the resulting quantum dot array 301, and thus can realize the quantum dot array device 300 having a desirable characteristic. Since the intrusion prevention layers 303 for preventing the first conductive material from intruding between a plurality of columnar parts 304 are formed before forming the conductive film 302 after forming the columnar parts 304, the first conductive material is fully prevented from intruding between the plurality of columnar parts 304 at the time of forming the conductive film 302 by electron beam vapor deposition. This fully prevents the quantum dots 6 of the columnar parts 304 adjacent to each other from short-circuiting and the quantum dots 6 of one columnar part 304 from short-circuiting, whereby the quantum dot array device 300 is fully prevented from failing to function normally.

Second Embodiment of Method of Manufacturing Quantum Dot Array Device

A second embodiment of the method of manufacturing a quantum dot array device in accordance with the present invention will now be explained in detail. Constituents identical or equivalent to those of the first and second embodiments of the quantum dot array will be referred to with the same numerals while omitting their overlapping explanations.

Before explaining the second embodiment of the method of manufacturing a quantum dot array device in accordance with the present invention, the quantum dot array device manufactured by this method will be explained with reference to FIG. 8.

Figure 8:
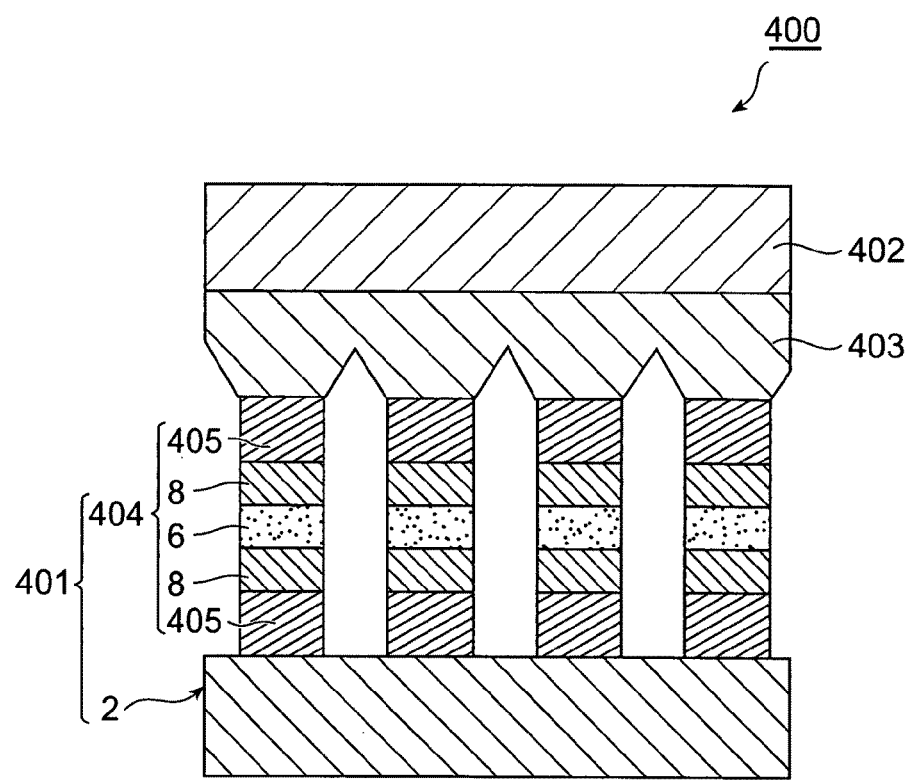
FIG. 8 is a sectional view showing another embodiment of the quantum dot array device in accordance with the present invention.

FIG. 8 is a sectional view schematically showing the quantum dot array device manufactured by the second embodiment of the method of manufacturing a quantum dot array device in accordance with the present invention. As shown in FIG. 8, the quantum dot array device 400 comprises a quantum dot array 401 and a conductive film 402 provided on a plurality of columnar parts 404 of the quantum dot array 401. Here, each of the plurality of columnar parts 404 extends in a direction orthogonal to the surface 2a of the substrate 2, and is constituted by an electrode layer 405, a barrier layer 8, a quantum dot 6, a barrier layer 8, and an electrode layer 405. Each of the electrode layers 405 has a size greater than that of a quantum dot, does not function as the quantum dot, and is constituted by a conductive material such as B-doped silicon, for example. Intrusion prevention layers 403 for preventing conductive materials from intruding between the plurality of columnar parts 404 at the time of manufacturing the quantum dot array device 400 are provided between the respective columnar parts 404 and the conductive film 402. Here, the intrusion prevention layers 403 increase their diameters as they are distanced more from the columnar parts 404, i.e., as they approach the conductive film 402 from the columnar parts 404, and are integrated on the conductive film 402 side.

As with the conductive film 302, the conductive film 402 is usually constituted by a metal material such as aluminum, but may also be by conductive oxides such as tin-doped indium oxide and antimony-doped tin oxide and semiconductor materials such as B-doped silicon. The intrusion prevention layers 403 have a structure similar to that of the intrusion prevention layers 303.

The method of manufacturing the quantum dot array device 400 will now be explained.

First, the quantum dot array device 401 is obtained as in the second embodiment of the method of manufacturing a quantum dot array except that a boron (B)-doped silicon wafer is used as the substrate 2; that the electron beam vapor deposition apparatus further comprises a conductive film vapor deposition source container for accommodating a first conductive material as a vapor deposition source for the conductive film 402, an intrusion prevention layer vapor deposition source container for accommodating a second conductive material as a vapor deposition source for the intrusion prevention layers 403, and an electrode layer vapor deposition source for accommodating a conductive material as a vapor deposition source for the electrode layers 405; and that, when forming the columnar parts 404, the electrode layers 405 are formed between the substrate 2 and barrier layers 8 and between the barrier layers 8 and intrusion prevention layers 403 by electron beam vapor deposition, whereas only one layer of quantum dot 6 and two barrier layers 8 are formed. Namely, the quantum dot array 401 formed with a plurality of columnar parts 404 extending from the surface 2a of the substrate 2 in a direction orthogonal to the surface 2a is obtained.

At this time, the conductive film vapor deposition source container is arranged in front of the rotary table in the electron beam vapor deposition apparatus. The rotary table is movable along a fixed direction. When accommodating the materials constituting the barrier layers 8 and quantum dots 6 into the barrier layer vapor deposition source container and the quantum dot vapor deposition source container, respectively, the first and second conductive materials and a material constituting the electrode layer are accommodated in the conductive film vapor deposition source container, the intrusion prevention layer vapor deposition source container, and the electrode layer vapor deposition source container, respectively.

Figure 9:
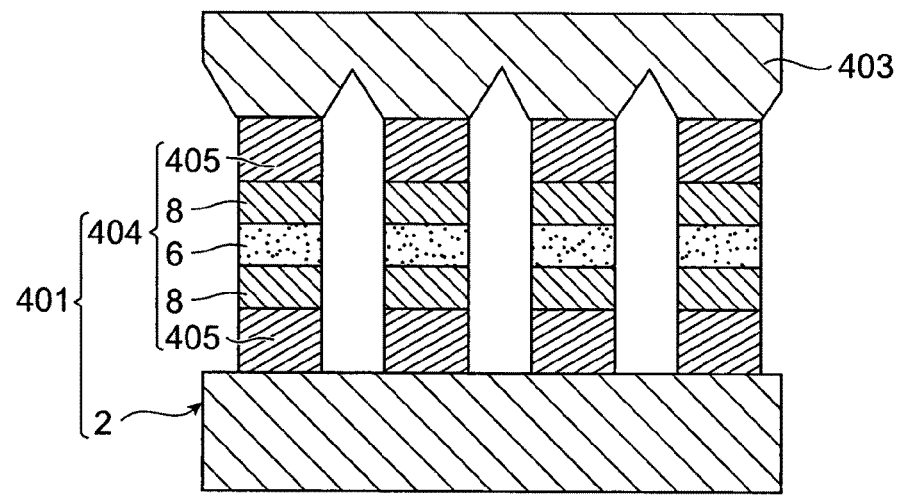
FIG. 9 is a view showing an intrusion prevention layer forming step in another embodiment of the method of manufacturing a quantum dot array device in accordance with the present invention.

Subsequently, while the quantum dot array 401 is contained in the vessel of the electron beam vapor deposition apparatus, the second conductive material as the vapor deposition source for the intrusion prevention layers 403 is irradiated with an electron beam, so as to be evaporated by heating. At this time, the rotary table is rotated. Specifically, the rotary table is rotated such that the substrate 2 revolves about the normal 5 of the surface 2a of the substrate 2. Concurrently, the rotary table is moved away from the vapor deposition source of the second conductive material as time passes. Here, the moving direction of the rotary table is a direction extending along the normal of the surface 2a of the substrate 2. Thus, the vapor deposition angle θ with respect to the normal of the surface 2a of the substrate 2 is changed so as to become smaller with time. Consequently, the intrusion prevention layers 403 increase their diameters on the respective columnar parts 404 with time until the intrusion prevention layers 403 adjacent to each other are integrated. This closes the gaps between the plurality of columnar parts 404. Thus, as shown in FIG. 9, the intrusion prevention layers 403 for preventing the first conductive material from intruding between the plurality of columnar parts 404 are formed on the respective columnar parts 404 (intrusion prevention layer forming step).

Next, the first conductive material as the vapor deposition source for the conductive film is irradiated with an electron beam, so as to be evaporated by heating. Here, since the conductive film vapor deposition source container is positioned in front of the surface 2a of the substrate 2, the vapor deposition source for the conductive film is vapor-deposited from the front side with respect to the surface 2a of the substrate 2. Thus, as shown in FIG. 8, the conductive film 402 is formed on the plurality of intrusion prevention layers 403 (conductive film forming step). This completes the manufacture of the quantum dot array device 400.

The above-mentioned manufacturing method can improve the uniformity in sizes of quantum dots 6 in the resulting quantum dot array 401, and thus can realize the quantum dot array device 400 having a desirable characteristic. Since the intrusion prevention layers 403 for preventing the first conductive material from intruding between a plurality of columnar parts 404 are formed before forming the conductive film 402 after forming the columnar parts 404, the first conductive material is fully prevented from intruding between the plurality of columnar parts 404 at the time of forming the conductive film 402 by electron beam vapor deposition. This fully prevents the quantum dots 6 of the columnar parts 404 adjacent to each other from short-circuiting and the quantum dots 6 of one columnar part 404 from short-circuiting, whereby the quantum dot array device 400 is fully prevented from failing to function normally.

Figure 10:
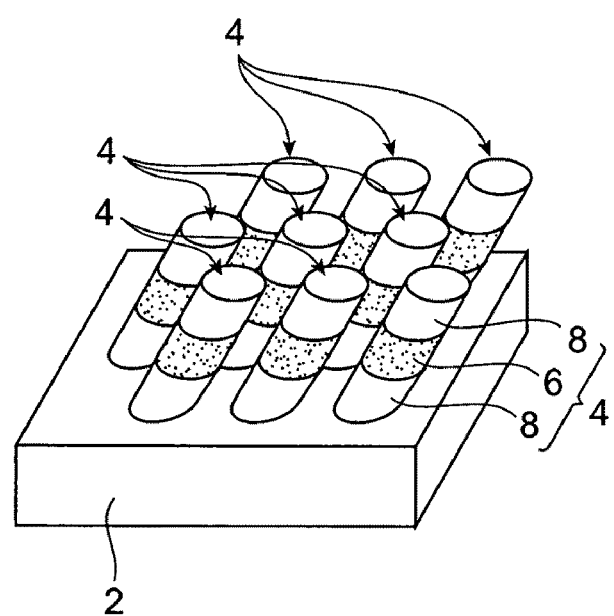
FIG. 10 is a perspective view showing still another embodiment of the quantum dot array in accordance with the present invention.

The present invention is not limited to the above-mentioned embodiments. For example, though one columnar part 4 contains three quantum dots 6 in the first embodiment of the method of manufacturing a quantum dot array, so that the quantum dots 6 are arranged three-dimensionally when seen as a whole, the quantum dots 6 may be provided by any number of 1 or greater. When one columnar part 4 contains only one quantum dot 6, however, the quantum dots 6 are arranged two-dimensionally as shown in FIG. 10 in the quantum dot array when seen as a whole.

Figure 11:
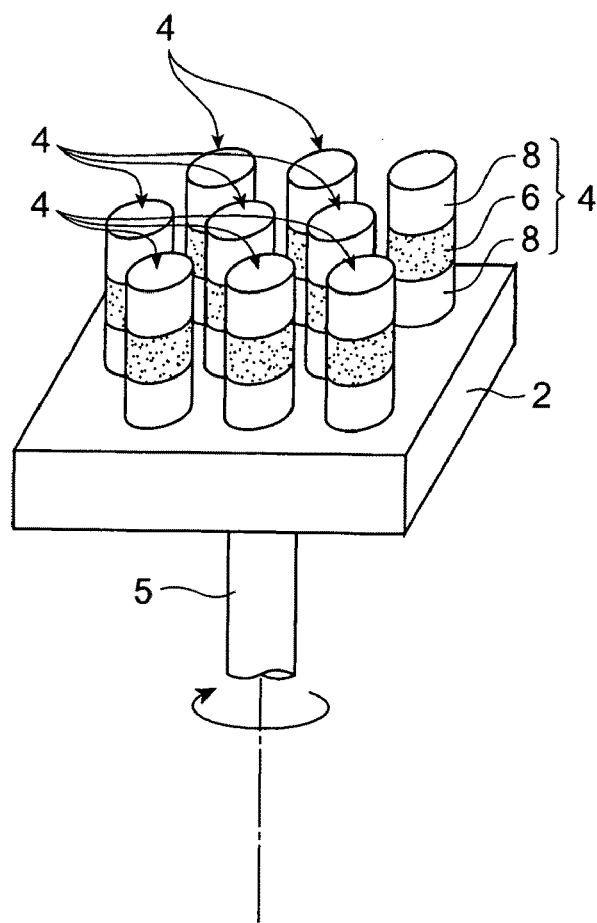
FIG. 11 is a perspective view showing still another embodiment of the quantum dot array in accordance with the present invention.

Though one columnar part 4 contains three quantum dots 6 in the second embodiment of the method of manufacturing a quantum dot array, so that the quantum dots 6 are arranged three-dimensionally when seen as a whole, the quantum dots 6 may be provided by any number of 1 or greater. When one columnar part 4 contains only one quantum dot 6, however, the quantum dots 6 are arranged two-dimensionally as shown in FIG. 11 in the quantum dot array when seen as a whole.

Though the above-mentioned first and second embodiments of the method of manufacturing a quantum dot array and first and second embodiments of the method of manufacturing a quantum dot array device perform vapor deposition by evaporating vapor deposition sources upon heating with electron beams, the vapor deposition may be carried out by using resistance heating vapor deposition, sputtering, ion beam sputtering, ion plating, laser abrasion, and the like.

Though the columnar parts 4 extending straight in a direction perpendicular to the surface 2a of the substrate 2 are formed on the substrate 2 in the above-mentioned second embodiment of the method of manufacturing a quantum dot array, spiral columnar parts can be obtained when the rotating speed of the substrate 2 is made slower than that in the second embodiment.

For crystallizing the quantum dots 6 or improving the crystallization, annealing may be carried out after forming the columnar parts 4, 304, 404. For annealing, electric furnaces and lamp annealing furnaces, for example, can be used. Laser annealing can also be used.

In the above-mentioned embodiments, the columnar parts 4, 304, 404 may be oxidized partly after yielding the above-mentioned columnar parts 4, 304, 404 or after carrying out annealing as mentioned above. In this case, the oxidized part functions as an energy barrier against the quantum dots 6, whereby the sizes of quantum dots 6 can be adjusted.

Though the barrier layers 8 are formed on the surface 2a of the substrate 2 in the above-mentioned first and second embodiments of the quantum dot array, an electrode layer for applying a voltage, for example, may be formed before forming the barrier layers 8. In this case, the columnar part 4 may have a structure further including an electrode layer, for example, on its topmost barrier layer 8. The electrode layer stated herein refers to one which has a size greater than that of a quantum dot and does not function as the quantum dot.

Though the columnar parts 304, 404 include the electrode layers 305, 405 in the above-mentioned first and second embodiments of the quantum dot array device, respectively, they may be omitted as well.

Figure 12:
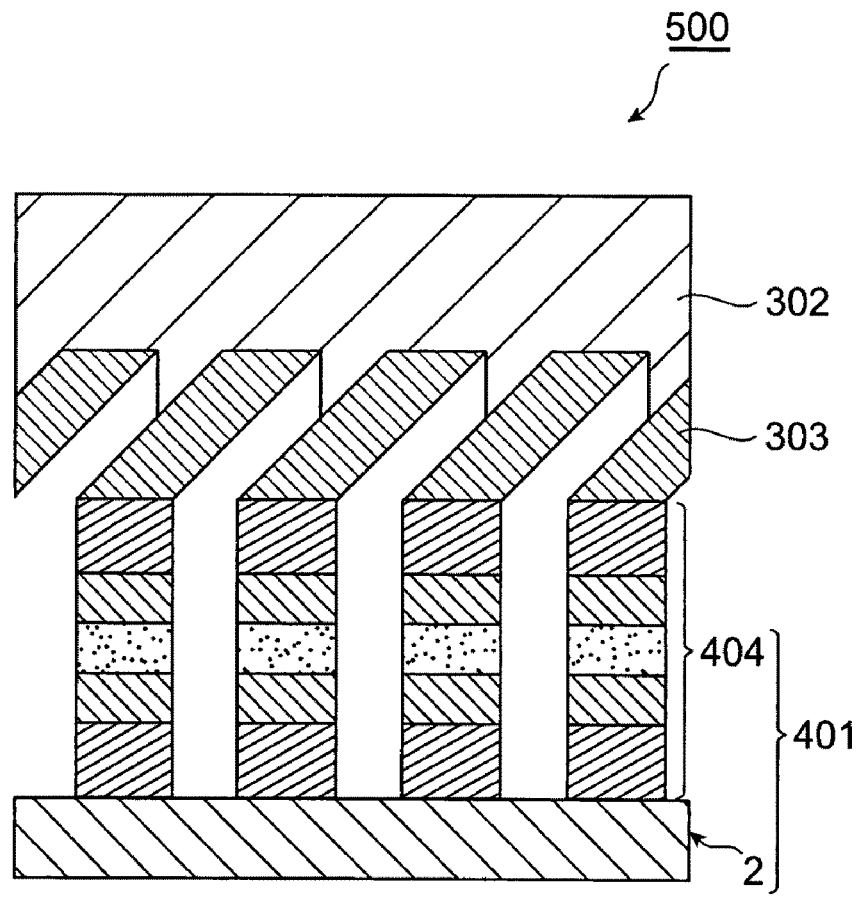
FIG. 12 is a sectional view showing still another embodiment of the quantum dot array device in accordance with the present invention.

The above-mentioned first embodiment of the quantum dot array device may use the quantum dot array 401 instead of the quantum dot array 301. Namely, the substrate 2 may be rotated about a normal of the surface thereof at the time of manufacturing a quantum dot array. This yields a quantum dot array device 500 as shown in FIG. 12.

EXAMPLES

In the following, details of the present invention will be explained more specifically with reference to examples and comparative examples, though the present invention is not limited to the following examples.

Example 1

First, a substrate was prepared. Used as the substrate was a B-doped silicon wafer cut into a 20-mm square in which a naturally oxidized film on the surface had been eliminated by a dilute aqueous solution of hydrofluoric acid.

This substrate was placed within an electron beam vapor deposition apparatus. At this time, the substrate was secured onto the fixed table in the electron beam vapor deposition apparatus. In the electron beam vapor deposition apparatus, the vapor deposition source containers for the barrier layers, quantum dots, and electrode layer are arranged obliquely with respect to the normal of the surface 2a of the substrate 2.

Next, a particle of $SiO_2$ having a particle size of 2 to 3 mm was accommodated as a vapor deposition source into the barrier layer vapor deposition source container within the vessel, a pellet of nondoped Si having a diameter of 10 mm and a thickness of 5 mm was accommodated as a vapor deposition source into the quantum dot vapor deposition source container, and a pellet of B-doped Si having a diameter of 10 mm and a thickness of 5 mm was accommodated as a vapor deposition source into the electrode layer vapor deposition source container.

Subsequently, the container was closed with a lid, the pressure therewithin was reduced to $5 \times 10^{-6}$ Pa or less, and then B-doped Si accommodated in the electrode layer vapor deposition source container was irradiated with an electron beam, so as to be evaporated by heating. At this time, the substrate was rotated at 10 rpm. Thus, B-doped Si was obliquely vapor-deposited with respect to the surface 2a of the substrate 2. The vapor deposition angle at that time was 75° from the normal of the substrate surface. The vapor deposition rate was 2 nm/min. Thus, an electrode layer having a thickness of 40 nm made of B-doped Si was formed on each barrier layer 8.

Next, the barrier layer vapor deposition source container was irradiated with an electron beam, so as to evaporate $SiO_2$ by heating. At this time, the substrate was rotated at 10 rpm. Thus, $SiO_2$ was obliquely vapor-deposited with respect to the surface 2a of the substrate 2. The vapor deposition angle at that time was 75° from the normal of the substrate surface. The vapor deposition rate was 2 nm/min. Thus, a plurality of barrier layers 8 having a thickness of 25 nm were yielded on the surface 2a of the substrate 2.

Subsequently, nondoped Si was irradiated with an electron beam again, so as to be evaporated by heating, thereby being obliquely vapor-deposited on the barrier layers 8. Thus, a quantum dot 6 having a thickness of 25 nm made of Si was formed on each barrier layer 8.

Next, $SiO_2$ was irradiated with an electron beam again, so as to be evaporated by heating, whereby a barrier layer 8 made of $SiO_2$ was formed on the quantum dot 6 in a manner similar to the above.

Then, B-doped Si accommodated in the electrode layer vapor deposition source container was irradiated with an electron beam, so as to be evaporated by heating. At this time, the substrate was rotated at 10 rpm. Thus, B-doped Si was obliquely vapor-deposited with respect to the surface 2a of the substrate 2. The vapor deposition angle at that time was 75° from the normal of the substrate surface. The vapor deposition rate was 2 nm/min. Thus, an electrode layer made of B-doped Si was formed on each barrier layer 8, whereby a plurality of columnar parts 4 were obtained.

Finally, the plurality of columnar parts 4 formed on the substrate were put into a furnace (a desktop lamp heating apparatus MILA-3000 manufactured by ULVAC-RIKO, Inc.) together with the substrate, and were annealed for 10 minutes at 900° C. in a nitrogen atmosphere, whereby the quantum dots 6 made of nondoped Si and the electrode layers made of B-doped Si were crystallized. Thus, a quantum dot array was obtained.

Figure 13:
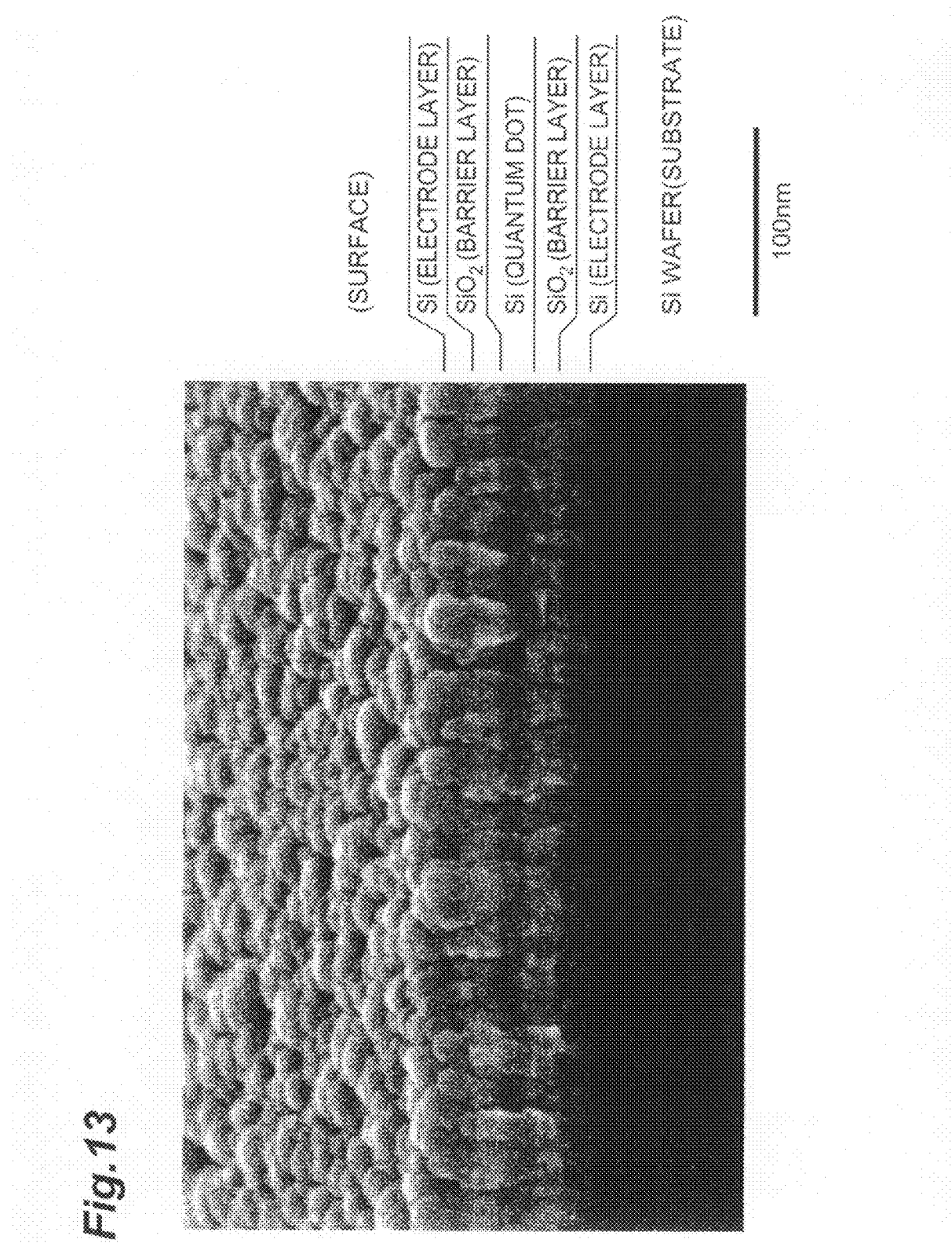
FIG. 13 is a view showing an SEM photograph image of the quantum dot array in accordance with Example 1.

The quantum dot array obtained by Example 1 was observed with SEM. FIG. 13 shows the result. FIG. 13 indicates that the lowermost part is the substrate 2, while the electrode layer made of B-doped Si, the barrier layer made of $SiO_2$, the quantum dot made of nondoped Si, the barrier layer made of $SiO_2$, and the electrode layer made of B-doped Si are successively provided on the substrate 2. This result proved that the quantum dots had uniform sizes in each columnar part in Example 1.

Example 2

A quantum dot array was obtained as in Example 1 except that each of the vapor deposition angles of $SiO_2$ as the material constituting the barrier layers and nondoped Si as the material constituting the quantum dots with respect to the surface 2a of the substrate 2 was changed from 75° to 80°.

Figure 14:
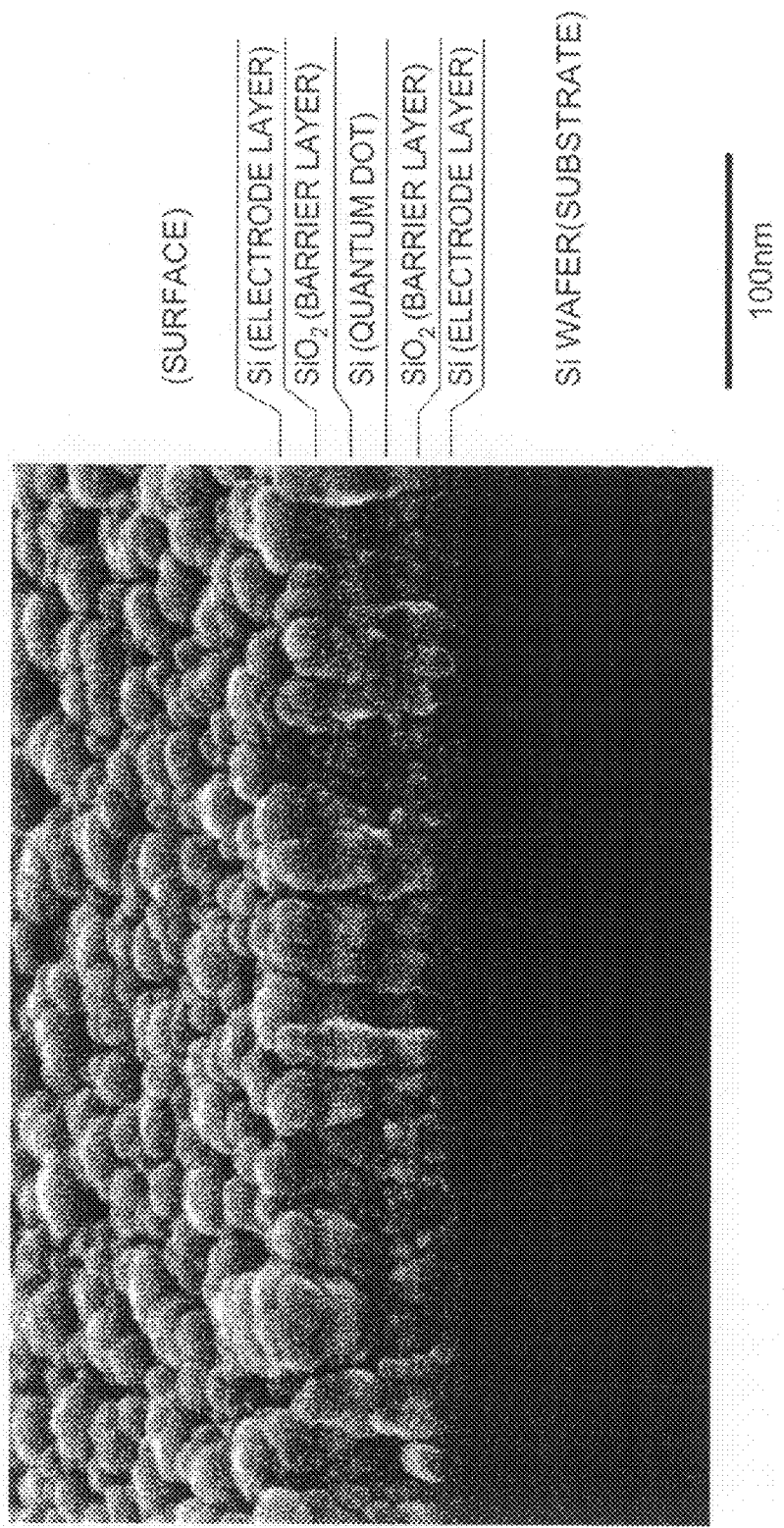
FIG. 14 is a view showing an SEM photograph image of the quantum dot array in accordance with Example 2.

This quantum dot array was observed with SEM as in Example 1. FIG. 14 shows the result. FIG. 14 indicates that the lowermost part is the substrate 2, while the electrode layer made of B-doped Si, the barrier layer made of $SiO_2$, the quantum dot made of nondoped Si, the barrier layer made of $SiO_2$, and the electrode layer made of B-doped Si are successively provided on the substrate 2. This result proved that the quantum dots had uniform sizes in each columnar part in Example 2.

Example 3

Figure 15:
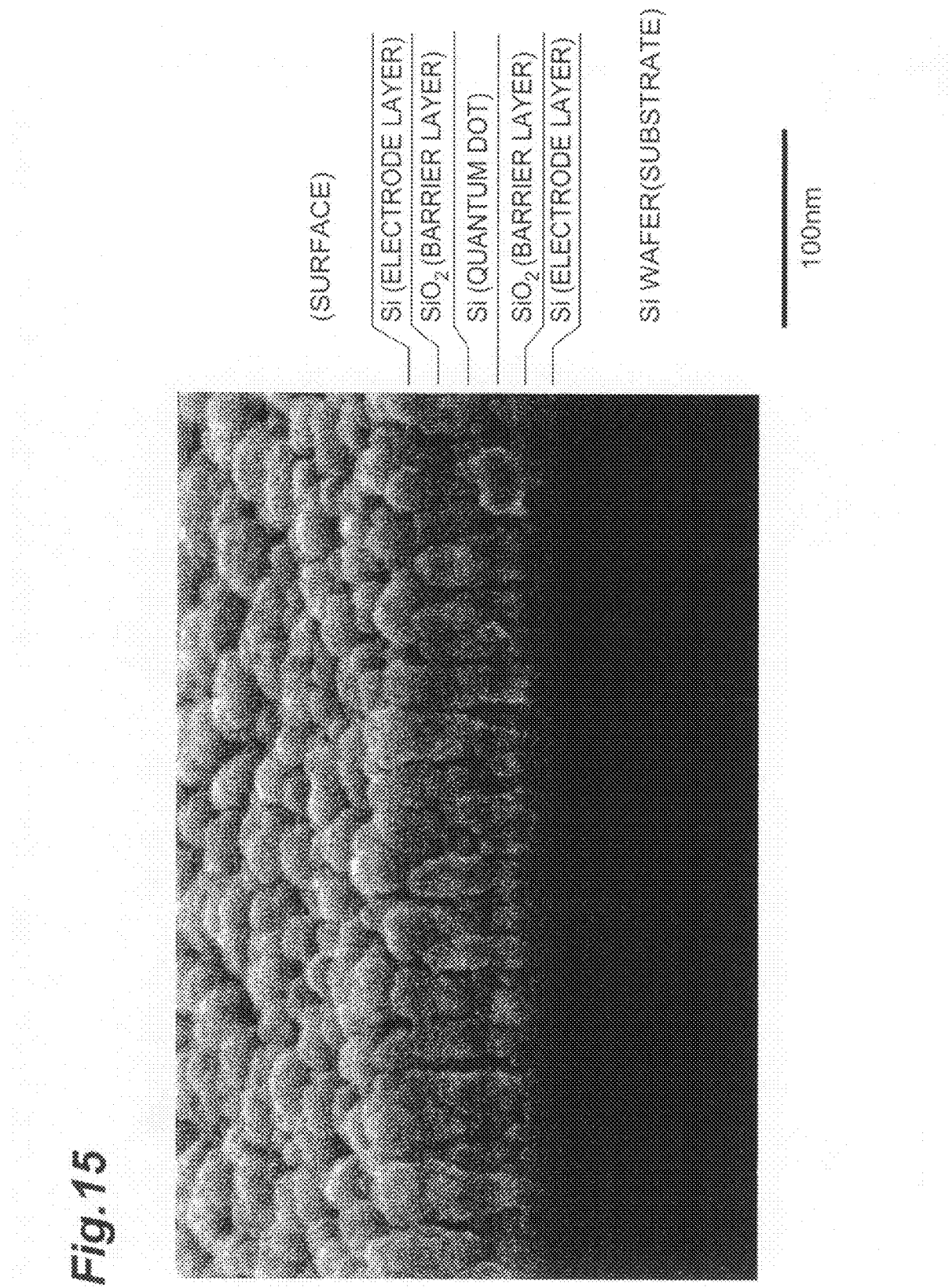
FIG. 15 is a view showing an SEM photograph image of the quantum dot array in accordance with Example 3.

A quantum dot array was obtained as in Example 1 except that each of the vapor deposition angles of $SiO_2$ as the material constituting the barrier layers and nondoped Si as the material constituting the quantum dots with respect to the surface 2a of the substrate 2 was changed from 75° to 85°. This quantum dot array was observed with SEM as in Example 1. FIG. 15 shows the result. FIG. 15 indicates that the lowermost part is the substrate 2, while the electrode layer made of B-doped Si, the barrier layer made of $SiO_2$, the quantum dot made of nondoped Si, the barrier layer made of $SiO_2$, and the electrode layer made of B-doped Si are successively provided on the substrate 2. This result proved that the quantum dots had uniform sizes in each columnar part in Example 3.

Example 4

A quantum dot array was obtained as in Example 2 except that the material constituting the barrier layers was changed from $SiO_2$ to $Si_3N_4$ and that an $N_2$ gas at 0.1 Pa was introduced into the vessel constituting the electron beam vapor deposition apparatus at the time of vapor-depositing the constituent material of the barrier layers. This quantum dot array was observed with SEM as in Example 1. As a result, the quantum dots were seen to have uniform sizes in each columnar part as in Example 1.

Example 5

A quantum dot array was obtained as in Example 3 except that the substrate, the material constituting the quantum dots, the material constituting the electrode layers, and the material constituting the barrier layers were a B-doped Ge wafer, nondoped Ge, B-doped Ge, and $GeO_2$, respectively. This quantum dot array was observed with SEM as in Example 1. As a result, the quantum dots were seen to have uniform sizes in each columnar part as in Example 1.

Example 6

A quantum dot array was obtained as in Example 2 except that a glass substrate was used as the material constituting the substrate instead of the B-doped silicon wafer; that the thickness of each barrier layer was 50 nm while the thickness of each quantum dot was 20 nm; that no electrode layer was formed; and that a film of $SiO_2$ having a thickness of 100 nm was formed by sputtering on columnar parts each made of the barrier layer, quantum dot, and barrier layer in order to prevent its surface from being oxidized and then was heat-treated for 30 minutes at 600° C. in an $N_2$ atmosphere. This quantum dot array was observed with SEM as in Example 1. As a result, the quantum dots were seen to have uniform sizes in each columnar part as in Example 1.

Example 7

A quantum dot array was obtained as in Example 3 except that a glass substrate was used as the material constituting the substrate instead of the B-doped silicon wafer; that CdS was used as the material constituting the quantum dots; that the thickness of each barrier layer was 50 nm, while the thickness of each quantum dot was 30 nm; that no electrode layer was formed; and that a film of $SiO_2$ having a thickness of 100 nm was formed by sputtering on columnar parts each made of the barrier layer, quantum dot, and barrier layer in order to prevent its surface from being oxidized and then was heat-treated for 30 minutes at 300° C. in an $N_2$ atmosphere. This quantum dot array was observed with SEM as in Example 1. As a result, the quantum dots were seen to have uniform sizes in each columnar part as in Example 1.

Example 8

Figure 16:
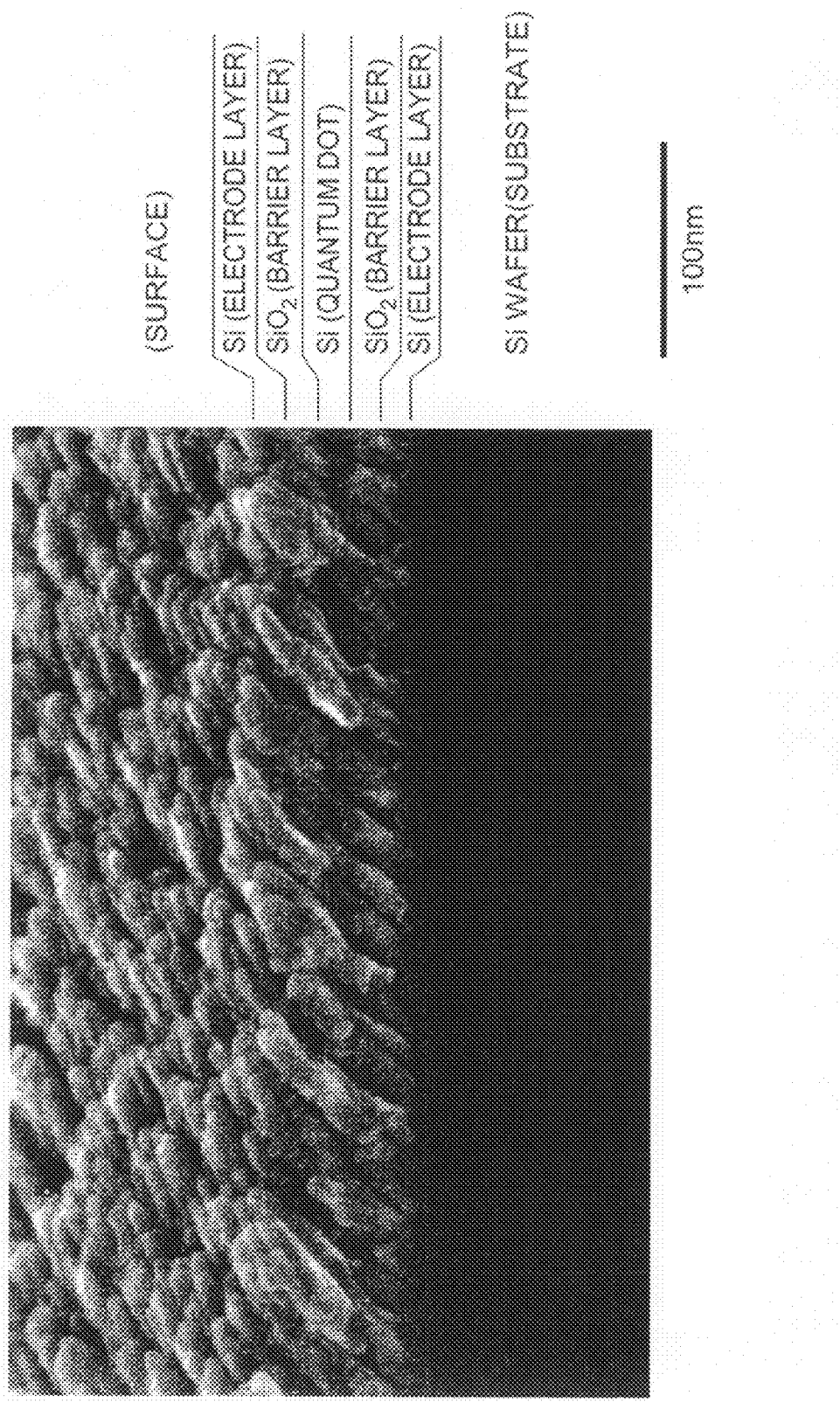
FIG. 16 is a view showing an SEM photograph image of the quantum dot array in accordance with Example 8.
Figure 17:
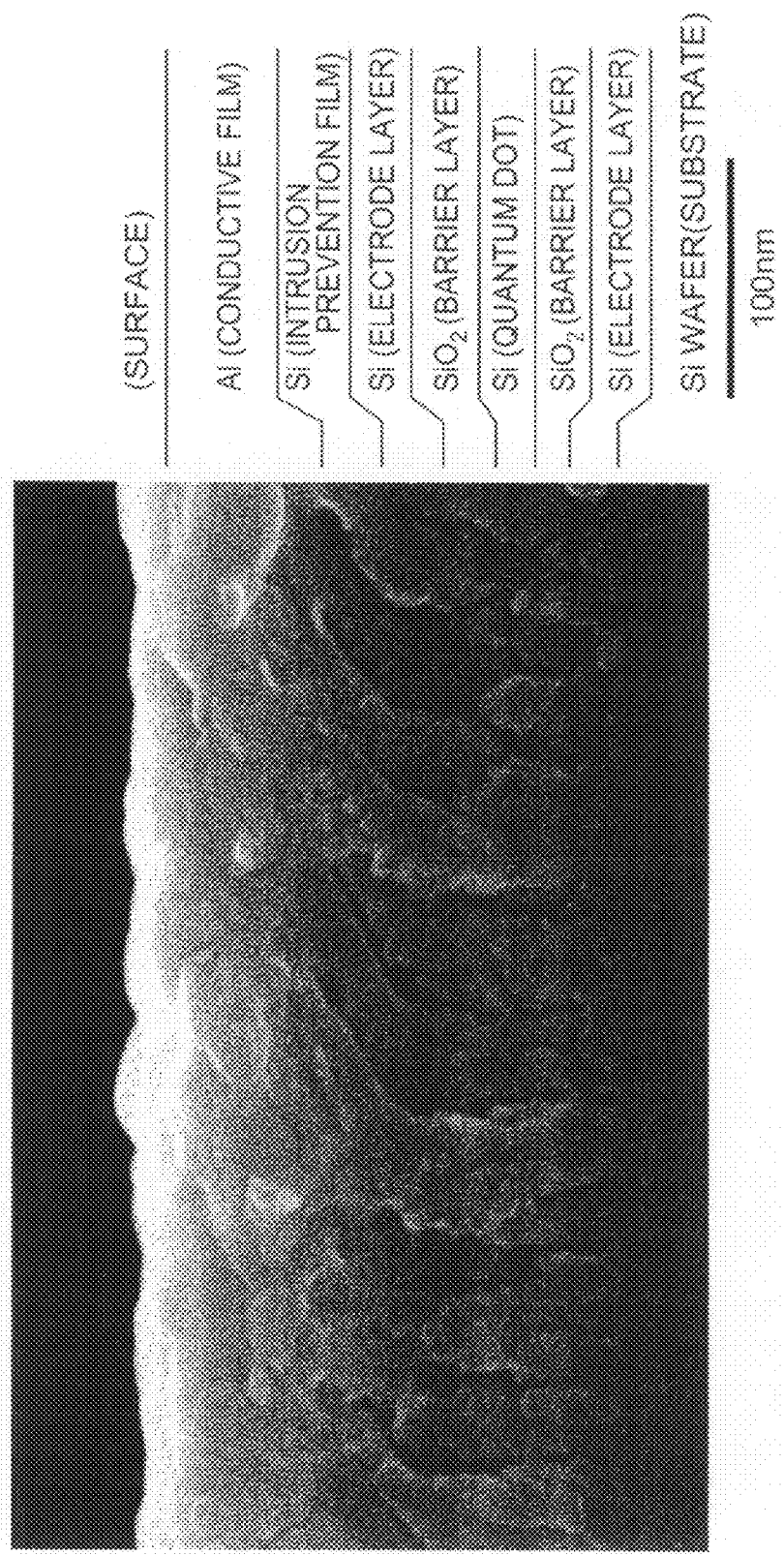
FIG. 17 is a view showing an SEM photograph image of the quantum dot array device in accordance with Example 9.

A quantum dot array was obtained as in Example 2 except that the substrate 2 was not rotated at the time of vapor-depositing $SiO_2$ as the material constituting the barrier layers and B-doped Si as the material constituting the quantum dots with respect to the surface 2a of the substrate. This quantum dot array was observed with SEM as in Example 1. FIG. 16 shows the result. FIG. 16 indicates that the lowermost part is the substrate 2, while the electrode layer made of B-doped Si, the barrier layer made of $SiO_2$, the quantum dot made of nondoped Si, the barrier layer made of $SiO_2$, and the electrode layer made of B-doped Si are successively provided on the substrate 2. This result proved that the quantum dots had uniform sizes in each columnar part in Example 8.

Example 9

First, a quantum dot array was obtained as in Example 3. Here, in the electron beam vapor deposition apparatus, the conductive film vapor deposition source container was arranged in front of the quantum dot array, and a first conductive material (Al) and a second conductive material (B-doped Si) were accommodated in the conductive film vapor deposition source container and intrusion vapor deposition source container, respectively, at the time of putting the materials constituting the barrier layers 8 and quantum dots 6 into these containers, respectively.

Subsequently, while the quantum dot array was contained in the vessel of the electron beam vapor deposition apparatus, B-doped Si as the vapor deposition source for intrusion prevention layers was irradiated with an electron beam, so as to be evaporated by heating, thereby being obliquely vapor-deposited with respect to the surface of the substrate. Here, the substrate was kept still. Thus, the intrusion prevention layers for preventing the first conductive material from intruding between a plurality of columnar parts were formed on the respective columnar parts. Here, the intrusion prevention layers were formed such that a leading end part of the intrusion prevention layer hung over the leading end face of the adjacent columnar part when seen in a normal of the surface of the substrate. Here, the vapor deposition angle θ was 80°.

Finally, Al as the vapor deposition source for the conductive film was irradiated with an electron beam, so as to be evaporated by heating, thereby forming a conductive film. Here, while the substrate was kept still, the vapor deposition source for the conductive film was vapor-deposited from the front side with respect to the surface of the substrate. Thus, a quantum dot array device was obtained.

In thus obtained quantum dot array device, the distribution of the first conductive material in the thickness direction was studied by secondary ion mass spectrometry. As a result, Al as the first conductive material was not seen below the intrusion prevention layers. This proved that no first conductive material intruded between the columnar parts.

Example 10

A quantum dot array device was obtained as in Example 9 except that the quantum dot array was manufactured as in Example 8 and that each of the vapor deposition angle of the material constituting the quantum dots and the deposition angle of the material constituting the barrier layers was 85°.

In thus obtained quantum dot array device, whether the first conductive material intruded between the columnar parts or not was studied as in Example 9. As a result, no intrusion of the first conductive material was seen between the columnar parts.

Example 11

A quantum dot array device was obtained as in Example 9 except that the quantum dot array was manufactured as in Example 3, that each of the vapor deposition angle of the material constituting the quantum dots and the vapor deposition angle of the material constituting the barrier layers was 85°, and that the vapor deposition angle of the second conductive material as the material constituting the intrusion prevention layers was initially 85° and thereafter was changed so as to become gradually smaller at a rate of 2°/min until it became 15°.

In thus obtained quantum dot array device, whether the first conductive material intruded between the columnar parts or not was studied as in Example 9. As a result, no intrusion of the first conductive material was seen between the columnar parts.

Comparative Example 1

A quantum dot array was obtained as in Example 6 except that none of the barrier layers and electrode layers was formed. This quantum dot array was observed with SEM as in Example 1. As a result, it was found in Comparative Example 1 that the quantum dots in each columnar part had various sizes which were not uniform.

Comparative Example 2

A quantum dot array was obtained as in Example 7 except that none of the barrier layers and electrode layers was formed. This quantum dot array was observed with SEM as in Example 1. As a result, it was found in Comparative Example 2 that the quantum dots in each columnar part had various sizes which were not uniform.

The foregoing results verified that the method of manufacturing a quantum dot array and method of manufacturing a quantum dot array device in accordance with the present invention were able to improve the uniformity in sizes of a plurality of quantum dots. Also, the method of manufacturing a quantum dot array device in accordance with the present invention was seen to be able to prevent the first conductive material constituting the conductive film from intruding between the columnar parts. These seem to indicate that the method of manufacturing a quantum dot array device in accordance with the present invention fully prevents the quantum dots of the columnar parts adjacent to each other from short-circuiting and the quantum dots of one columnar part from short-circuiting, whereby the quantum dot array device is fully prevented from failing to function normally.

INDUSTRIAL APPLICABILITY

The method of manufacturing a quantum dot array and the quantum dot array manufactured by using the same and the method of manufacturing a quantum dot array device and the quantum dot array device using the same in accordance with the present invention can improve the uniformity in sizes of a plurality of quantum dots, and thus can realize desirable characteristics in each of the quantum dot array and the quantum dot array device utilizing the same.

The invention claimed is:

1. A method of manufacturing a quantum dot array having a plurality of columnar parts including a quantum dot on a substrate, the method comprising:
    a first step of obliquely vapor-depositing a material constituting a first barrier layer to become an energy barrier against the quantum dot with respect to a surface of the substrate, so as to form a plurality of the first barrier layers;
    a second step of obliquely vapor-depositing a material constituting the quantum dot with respect to the surface of the substrate, so as to form the quantum dots on the respective first barrier layers; and
    a third step of obliquely vapor-depositing a material constituting a second barrier layer to become an energy barrier against the quantum dot with respect to the surface of the substrate, so as to form the second barrier layers on the respective quantum dots.

2. A method of manufacturing a quantum dot array according to claim 1, wherein the substrate is rotated about a normal of the surface of the substrate in the first, second, and third steps.

3. A method of manufacturing a quantum dot array according to claim 1, wherein a deposition angle with respect to a normal of the surface of the substrate is at least 30° in the first, second, and third steps.

4. A method of manufacturing a quantum dot array according to claim 1, wherein the temperature of the substrate in the first step is ⅓ or less of the melting point of the material constituting the first barrier layers in terms of absolute temperature, the temperature of the substrate in the second step is ⅓ or less of the melting point of the material constituting the quantum dots in terms of absolute temperature, and the temperature of the substrate in the third step is ⅓ or less of the melting point of the material constituting the second barrier layers in terms of absolute temperature.

5. A method of manufacturing a quantum dot array according to claim 1, further comprising:
    a fourth step of obliquely vapor-depositing a material constituting the quantum dot with respect to the surface of the substrate, so as to form the quantum dots on the respective second barrier layers; and
    a fifth step of obliquely-depositing a third barrier layer to become an energy barrier against the quantum dot with respect to the surface of the substrate, so as to form the third barrier layers on the respective quantum dots.

6. A method of manufacturing a quantum dot array according to claim 5, wherein the substrate is rotated about a normal of the surface of the substrate in the first to fifth steps.

7. A method of manufacturing a quantum dot array device comprising the quantum dot array obtained by the method of manufacturing a quantum dot array according to claim 1 and a conductive film formed on the plurality of columnar parts of the quantum dot array, the substrate having a conductive part, the method comprising:

a conductive film forming step of forming the conductive film on the plurality of columnar parts of the quantum dot array by vapor deposition of a first conductive material; and an intrusion prevention layer forming step of forming intrusion prevention layers for preventing the first conductive material from intruding between the plurality of columnar parts on the respective columnar parts by vapor deposition of a second conductive material before the conductive film forming step after forming the plurality of columnar parts.

8. A method of manufacturing a quantum dot array device according to claim 7, wherein the intrusion prevention film forming step obliquely vapor-deposits the second conductive material with respect to the surface of the substrate, so as to form the intrusion prevention layer such that at least a leading end part of the intrusion prevention layer hangs over a leading end face of the adjacent columnar part when seen in a normal of the surface of the substrate.

9. A method of manufacturing a quantum dot array device according to claim 7, wherein, at the time of vapor-depositing the second conductive material with respect to the surface of the substrate in the intrusion prevention layer forming step, the vapor deposition angle with respect to the normal of the surface of the substrate is changed so as to become gradually smaller while rotating the substrate, thereby integrating the respective intrusion prevention layers formed on the plurality of columnar parts.

* * * * *